(12) United States Patent
Cakmak et al.

(10) Patent No.: US 8,455,273 B2
(45) Date of Patent: Jun. 4, 2013

(54) METHOD FOR PRODUCING CRYSTALLINE NITRIDE PHOSPHORS

(75) Inventors: Hasan Cakmak, Stuttgart (DE); Martin Jansen, Leonberg (DE)

(73) Assignee: Max-Planck-Gesellschaft zur Forderung der Wissenschaften E.V., Munich (DE)

( * ) Notice: Subject to any disclaimer, the term of this patent is extended or adjusted under 35 U.S.C. 154(b) by 0 days.

(21) Appl. No.: 13/062,778

(22) PCT Filed: Sep. 15, 2009

(86) PCT No.: PCT/EP2009/061969
§ 371 (c)(1),
(2), (4) Date: Mar. 8, 2011

(87) PCT Pub. No.: WO2010/029184
PCT Pub. Date: Mar. 18, 2010

(65) Prior Publication Data
US 2011/0163344 A1    Jul. 7, 2011

(30) Foreign Application Priority Data
Sep. 15, 2008    (EP) .................................... 08016232

(51) Int. Cl.
*H01L 51/40*    (2006.01)

(52) U.S. Cl.
USPC .................. 438/22; 438/29; 257/13; 257/79; 257/98; 257/103; 257/E33.03; 257/E33.061

(58) Field of Classification Search
USPC .................... 438/22, 29; 257/13, 79, 98, 103, 257/E33.03, E33.061
See application file for complete search history.

(56) References Cited

U.S. PATENT DOCUMENTS
2002/0105269 A1    8/2002   Ellens et al.

FOREIGN PATENT DOCUMENTS
| | | |
|---|---|---|
| DE | 102006051756 | 5/2008 |
| DE | 102006051757 | 5/2008 |
| EP | 1104799 | 6/2001 |

OTHER PUBLICATIONS

Li, Y. Q. et al., "Luminescence properties of $CE^{3+}$—activated alkaline earth silicon nitride $M_2Si_5N_8$ (M=Ca, Sr, Ba) materials", Journal of Luminescence 2006, 116; 107-116.
Xie, Rong-Jun et al., "Silicon-based oxynitride and nitride phosphors for white LEDs—A Review", Science and Technology of Advanced Materials 2007, 8: 588-600.

*Primary Examiner* — Andy Huynh
(74) *Attorney, Agent, or Firm* — Kilpatrick Townsend & Stockton LLP

(57) ABSTRACT

This invention relates to a new method for the production of nitride-based phosphors, in particular, of phosphors containing rare earth elements. The phosphors can be used, for example, in light sources, especially in Light Emitting Devices (LEDs).

20 Claims, 5 Drawing Sheets

METHOD FOR PRODUCING CRYSTALLINE NITRIDE PHOSPHORS

CROSS REFERENCE TO RELATED APPLICATIONS

This application claims the benefit of International Application No. PCT/EP2009/061969, Sep. 15, 2009, which claims priority to EP 08016232.4 filed Sep. 15, 2008, which are both incorporated herein by reference in their entireties.

Description

This invention relates to a new method for the production of nitride-based phosphors, preferably crystalline nitride-based phosphors, in particular of phosphors containing rare earth elements. The phosphors can be used, for example, in light sources, especially in Light Emitting Devices (LEDs).

In comparison with the conventional lighting technologies, e.g. incandescent and fluorescent lamps, LED-based solid state lighting devices show remarkable improvements in terms of long lifetime, compactness, designability, environment friendliness and, most importantly, energy efficiency. Multi-chip light emitting diodes (mc-LEDs) and phosphor-converted LEDs (pc-LEDs) are two basic concepts to generate white light. This revolution in lighting technology is spreading all over the world and improving our everyday life. mc-LEDs are obtained by combining at least three, most often red, green and blue (RGB) LEDs. pc-LEDs use phosphors to convert the radiation of UV or blue LEDs. Although mc-LEDs have the advantageous of potentially higher efficiency and electronically control of the color, they require more complex design, i.e. a power source for each LED increasing the cost dramatically and not applicable for small sizes. And even worse, individual lighting character of each LED leads to an uneven color mixing and results in insufficient illumination. Therefore, without doubt, in this revolution, wavelength conversion phosphors play a crucial role (C. Ronda: Luminescence, WILEY-VCH Verlag, Weinheim, 2008).

After the discovery of efficient blue-LEDs by Nakamura, the first white-LEDs by combining a InGaN-based blue-LED emitting at 465 nm with a broad-band yellow phosphor, e.g. $(Y_{1-x}Gd_x)_3(Al_{1-y}Ga_y)_5O_{12}:Ce^{3+}$ (cerium-doped Yttrium Aluminum Garnet (YAG:Ce)) was immediately commercialized (S. Nakamura: The Blue Laser Diode, Springer-Verlag, Berlin, 1997 and U.S. Pat. No. 5,998,925). Although this type of white LEDs still has a big share in the market, they have inadequate color rendering properties due to lack of green and red color elements. Therefore, tremendous efforts have been spent in recent years among the researchers to develop new phosphor systems, especially red ones.

Recently, Jansen et al. has reported, in DE 10 2006 051757 A1, a novel class of phosphors based on amorphous $Si_3B_3N_7$ ceramics, which show outstanding thermal, mechanical and chemical stabilities together with very promising photoluminescence properties, mainly for general illumination purposes. Since these phosphors have an amorphous network, there is an inhomogeneous line broadening in emission spectra, e.g. $Eu^{2+}$ and $Ce^{3+}$ doped amorphous $Si_3B_3N_7$ ceramics have very broad emission bands in the visible region of the spectrum. Thus, obtaining narrower emission bands, especially orange to red part of the visible spectrum, which can be vital for some specific applications, is not very probable in these amorphous luminescent $Si_3B_3N_7$ ceramics. In that respect, nitridosilicate-type crystalline phosphors possess superior photoluminescence properties (e.g., relatively sharp and very intense orange to red emissions) together with outstanding thermal, chemical and mechanical stabilities and structural diversities compared to other phosphor systems, such as oxides, sulfides and halides. Therefore, an extensive research is going on both in industry and in academia to synthesize new crystalline nitridosilicate-type phosphors and, especially, to find an elegant way for mass-production of these materials.

New host lattices of nitridosilicate type, $M_2Si_5N_8$ (M=Ca, Sr, Ba), consist of a three dimensional network of crosslinked $SiN_4$ tetrahedra in which alkaline earth ions Ca, Sr and Ba are incorporated. Such lattices were first synthesized by Schnick and co-workers and examples are $Ca_2Si_5N_8$ (Schlieper and Schnick, Z. anorg. Allg. Chem. 621, (1995), 1037), $Sr_2Si_5N_8$ and $Ba_2Si_5N_8$ (Schlieper, Millus and Schnick, Z. anorg. Allg. Chem. 621, (1995), 1380), and $BaSi_7N_{10}$ (Huppertz and Schnick, Chem. Eur. J. 3 (1997), 249). They applied the reaction of stoichimetric amounts of metal M (M=Ca, Sr, Ba) and europium metal (Eu) with silicon diimide $(Si(NH)_2)$ in a tungsten crucible by using a radio frequency furnace at extreme temperature and times (e.g. for $Ba_2Si_5N_8$:Eu, the W-crucible was heated under nitrogen to 800° C. within 30 min, kept at 800° C. for 1 hour, then heated within 25 hours to 1600° C. and maintained at this temperature for 40 hours, further heated to 1650° C. within 2 hours and finally quenched to room temperature within 30 minutes) according to following reaction (H. A. Höppe, H. Lutz, P. Morys, W. Schnick, A. Seilmeier J. Phys. Chem. Solids 61, (2000), 2001):

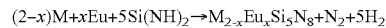

$$(2-x)M + xEu + 5Si(NH)_2 \rightarrow M_{2-x}Eu_xSi_5N_8 + N_2 + 5H_2$$

The phosphors produced thereby show orange to red emission and have high quantum efficiency and very low thermal quenching which makes them very promising red phosphors in white LEDs to improve the color rendering properties. Although these orange-to-red phosphors show the best properties ever achieved, the original synthesis method was not applicable to industrial scale. First of all the raw powder $Si(NH)_2$ is not commercially available and has to be synthesized separately. Furthermore, it is, together with other reactants, very sensitive to oxygen and moisture and has to be grinded in a dry-box which makes them difficult in handling. And even worse, pyrolysis is performed in a radio frequency furnace in a tungsten crucible at extreme temperature and times which makes the cost very high and the yield very low. Therefore, this multistep and complex procedure is not considered as industrial scale production.

After this pioneering work, different groups tried to find more reasonable ways to synthesize these compounds. An alternative route has been proposed by the group of Hintzen (Li, Y. Q.; van Steen, J. E. J.; van Krevel J. W. H.; Botty, G.; Delsing, A. C. A.; DiSalvo, F. J.; de With, G.; Hintzen, H. T. *J. Alloy & Comp.* 2006, 417, 273 and EPI 104799). They have reacted metal nitride ($Ca_3N_2$, $SrN_x$ (x≈0.6-0.66), $BaN_x$ (x≈0.6-0.66)) and europium nitride ($EuN_x$ (x≈0.94)) with silicon nitride ($\alpha$-$Si_3N_4$) in a Mo crucible in a horizontal tube or graphite furnace (the appropriate amounts of starting materials were ground in an agate mortar and fired twice with a medium grinding in between at 1300-1400° C. for 12 and 16 hours, respectively) under a nitrogen atmosphere according to following reaction:

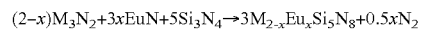

$$(2-x)M_3N_2 + 3xEuN + 5Si_3N_4 \rightarrow 3M_{2-x}Eu_xSi_5N_8 + 0.5xN_2$$

Nitridation of Eu, Ba and Sr were done separately and grounded together with the other reactants in an agate mortar in a dry-box, which again makes the handling difficult and tedious. This method is also a multistep and complex procedure which is less laborious for mass production and, therefore, it is regarded as a method superior to the previous one.

Later, Machida and co-workers proposed the carbothermal reduction and nitridation (CRN) method to produce $M_2Si_5N_8:Eu^{2+}$ (M=Ca, Sr) in a graphite is crucible in a radio frequency furnace using a two-step heating (first to 1200° C. for 2 hours to decompose $MCO_3$ to MO and then to 1550° C. for 6 hours) under $N_2$ flow based on the following chemical reaction (Piao, X.; Horikawa, T.; Hanzawa, H.; Machida, K. *Appl. Phys. Lett.* 2006, 88, 161908 and Piao, X.; Horikawa, T.; Hanzawa, H.; Machida, K. *J. of Electrochemical Soc.* 2006, 153 (12) H232):

The same authors have recently synthesized $CaSr_{1-x}Eu_xSi_5N_8$ with the same procedure by using $CaCN_2$ instead of graphite powder (Piao, X.; Machida, K; Horikawa, T.; Hanzawa, H. *J. of Electrochemical Soc.* 2008, 155 (1) J17).

The big disadvantage of given method is that it is unavoidable to have residual carbon in the phosphor, which significantly reduces its absorption and emission. Annealing at temperatures above 600° C. in air for 2 hours or oxygen atmosphere can be applied in order to remove the residual carbon but Krevel et al. (van Krevel, J. W. H. Ph.D. Thesis, Eindhoven University of Technology, 2000) have reported that a heat treatment at 600° C. in air for 2 hours kills completely the red emission of $Sr_2Si_5N_8:Eu^{2+}$ due to the oxidation of $Eu^{2+}$ to $Eu^{3+}$. Therefore, the problem of complete removal of residual carbon in the final phosphor makes this method unlikely to be used for mass production.

Same authors in another publication mention that the CRN method can not be applied for the Ba analog because carbon does not work as an effective reducing agent due to having higher affinity to barium ions than to oxygen (Piao, X.; Machida, K.; Horikawa, T.; Hanzawa, H.; *Appl. Phys. Lett.* 2007, 91, 041908). Therefore, they have proposed the so-called self-propagating high temperature synthesis (SHS) method for $Ba_2Si_5N_8:Eu^{2+}$, which is widely used in the preparation of alloy compounds, borides, and nitrides. The precursor was the nominal $Ba_{2-x}Eu_xSi_5$ alloy powder synthesized from Si, Ba, and Eu metal shots. These raw materials were arc-melted several times to form a homogenous alloy ingot that was ground to fine powder. The alloy powder was loaded into a BN crucible and heated in a radio frequency furnace under a pure $N_2$ flow. After the SHS occurred at 1060° C., the temperature was increased to 1350-1450° C. and maintained for 8 h for further nitridation. Quite obviously this method is also not convenient for mass production.

Lastly, Rong-Jun and co-workers have proposed direct solid state reaction among metal carbonate ($MCO_3$, where M=Ca, Sr), $Eu_2O_3$, and $Si_3N_4$ in a gas-pressure sintering furnace with a graphite heater at 1600° C. for 2 hours under a 0.5 MPa $N_2$ according to following reaction (Xie, R.-J.; Hirosaki, N.; Suchiro, T; Sakuma, K.; Xu, F.-F.; Mitomo, M, *Chem. Matter.* 2006, 18, 5578):

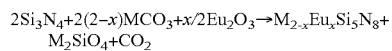

However, the problem of this process is that there is an undesired side reaction is going on together with the proposed reaction given above:

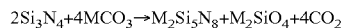

Therefore, the synthesized phosphor is a complex mixture of $M_2Si_5N_8:Eu^{2+}$ (~64 wt %) and $M_2SiO_4:Eu^{2+}$ (~36 wt %). The authors claim that the latter does not give emissions under the blue light excitation, making the complex phosphor resemble a single $M_2Si_5N_8:Eu^{2+}$ phosphor. Nevertheless, one can not obtain pure, single phase phosphors with this method.

Therefore, it was an object of the invention to provide an improved method for the production of nitride-based phosphors, in particular, rare earth element containing nitridosilicate phosphors, particularly based on a polymer route.

All these previously described methods are based on conventional all-solid-state reactions and either required complex synthesis techniques with long reaction times and additional synthesis steps for the starting material resulting difficult intermediate handling steps or resulted impure final products. The novelty in the present invention is that the production of the nitride based crystalline phosphors are based on a one-step reaction of commercially available liquid state reagents resulting a polymeric intermediate, which can directly be pyrolysed in a common horizontal furnace for comparably short reaction times. Since the most of the starting reagents are liquid, the high purity can easily be achieved by simple distillation techniques and any unreacted reagents or intermediate salt products can be recycled easily.

The present invention, therefore, provides an alternative method for the production of nitridosilicate-type phosphors based on a polymer route. The present invention has following advantageous compared to already available all-solid-state-synthesis methods: 1) All starting reagents are commercially available (no additional synthesis steps for the starting compounds, thus, no additional handling and grinding steps are required—a real one—pot synthesis) and can easily be purified either by simple distillation (e.g., liquids) or sublimation (e.g., metal-complexes) techniques. Therefore, high purity in the final crystalline compounds can easily be achieved, which is a major problem in all-solid-state reactions. 2) This method is based on a reaction in a liquid phase, which allows much better homogeneity in the final crystalline compounds. 3) Any unreacted or excess reagents and any sub-products can easily be recycled by simple distillation or sublimation techniques, which is environmentally and economically crucial 4) There is a polymeric intermediate during production, which may allow various polymer processing techniques to be applied, e.g. direct coating on an LED together with pyrolysis via a laser beam, without requiring any additional resin.

According to the invention, this object is achieved by a method for the production of nitrogen-containing phosphors, in particular crystalline nitrogen-containing phosphors comprising the step (i) reacting a halide with ammonia $NH_3$ and a metal source M, i.e. ammonlysis of a halide with a metal source M.

The inventors have found that nitride-based phosphors, preferably crystalline nitride-based phosphors, can be easily produced by using ammonia in a simple reaction, starting out from readily available starting materials such as halides as well as elemental metals or metal compounds. This makes a very interesting class of substances accessible, namely nitride-based phosphor materials.

According to the invention a metal source M is used. Said metal source M can contain activators (A), charge compensators (C) and/or sensitizers (B).

Activators, in particular, are rare earth elements, preferably selected from the group Ce, Pr, Nd, Sm, Eu, Gd, Tb, Dy, Ho, Er, Tm, Yb, Lu, Sc and/or Y. Most preferably, the activator is selected from Eu and/or Yb. The metal source M can comprise the activator in the form of metals, e.g. elemental Eu and/or elemental Yb. The metal source M, however, can also contain the activator in the form of activator ions. In a preferred embodiment, the metal source M comprises a complex containing the activator ion (RE complex) such as a complex of Ce, Mn, Pr, Nd, Sm, Eu, Gd, Tb, Dy, Ho, Er, Tm, Yb, Lu, Sc and/or Y.

However, it was found that some of the rare earth elements easily dissolve in ammonia, so it is often preferred to use simply rare earth elements such as Eu and/or Yb metal dissolved in ammonia as the metal source M.

Eu, Yb, alkaline and alkaline earth metals are soluble in liquid $NH_3$ and form solvated electrons:

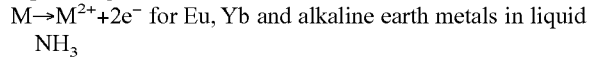
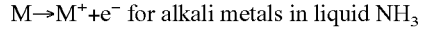

Therefore, during the reaction, they are in ionic form. On the other hand, if any given metal is not soluble in liquid $NH_3$, they can be used as molecular complex compounds.

In an especially preferred embodiment, the metal source M only contains activators, however, no sensitizers and/or charge compensators.

In a further embodiment of the invention, the metal source M contains charge compensators. Suitable charge compensators e.g. are alkali metals and/or earth alkali metals such as Li, Na, K, Rb, Cs, Ca, Sr and/or Ba. Preferably, the charge compensators are selected from Ca, Sr and/or Ba.

The metal source can also contain sensitizers. Suitable sensitizers e.g. are Sn, Mn, Zn, Sb, Pb and/or Bi.

According to the invention charge compensators and sensitizers, too, can be used in the form of metals or as ions.

In one embodiment, the metal source only contains activators without any sensitizers or charge compensators. In a further embodiment, the metal source only contains charge compensator ions and/or sensitizer ions without any activator ions. In said embodiment a nitrido-based matrix material is obtained.

In further embodiments, the metal source M contains either charge compensators or sensitizers, and activators. Hereby, a nitrido-based lattice is obtained which is doped with activators. The mole percent of activators with respect to compensators or sensitizers, respectively, is preferably between 0.1 and 99.9, in particular, between 1 and 20.

Finally, the metal source can comprise activators, charge compensators and sensitizers. The mole percent of sensitizers with respect to activators is preferably between 0.1 and 99.9, in particular, between 40 and 60.

As a further starting material, a halide is used according to the invention. The halide preferably is a binary halide, in particular, a halide having the formula $DX_n$, wherein D denotes an element of Group XIII, XIV or XV of the Periodic Table of Elements, X denotes halogen and n=3, 4 or 5.

D is an element which also can be found in the phosphor formed. For producing nitridosilicate phosphors, therefore, the halide used e.g. is a silicon-containing compound. In particular, D is an element selected from B, Al, Ga, In, TI, Si, Ge, Sn, Pb, P, As, Sb and/or Bi. Preferably, D is selected from an element of Group XIII or XIV of the Periodic Table of Elements. Especially preferably, D is selected from Si, Ge, B and/or Al.

X denotes halogen, in particular, F, Cl, Br, I and prefereably Cl. As a by-product in the reaction of the invention, $NH_4X$ is formed which can be easily separated from the desired product.

The reaction of the invention takes place in ammonia, $NH_3$. The reaction can be performed in pure liquid ammonia, to which the halide and the metal source are added. It has been found that the above-described metal sources are excellently soluble in $NH_3$ and, thus, a reaction with halides in the presence of $NH_3$ is possible.

Pure liquid ammonia hereby especially means ammonia having a purity of $\geq 95$ wt. %, more preferably $\geq 98$ wt. %.

However, it is also possible to carry out the reaction in a mixture of ammonia and a solvent. Suitable solvents, for example, are hydrocarbon solvents, in particular, $C_1$-$C_{10}$, more preferably $C_6$-$C_{10}$ alkanes. Hexane is especially preferred as a co-solvent.

When the reaction of step (i) is concluded, by-products can be easily separated from the desired compound and recycled, if desired. Excess ammonia, for example, can be separated in a cold trap under ambient conditions and recycled. Any solvent used such as hexane can be separated under vacuum in a cold trap. Further, $NH_4X$ is formed in the reaction, especially $NH_4Cl$ which can be separated easily by sublimation. As a result, a polymeric intermediate is obtained, which can be directly coated on an LED without requiring any additional resin. Furthermore, this polymer can be processed easily for any desired shape. According to a further preferred embodiment the polymeric intermediate is obtained in powder form.

In a further step (ii), the product obtained then can be subjected to a heat treatment, in particular, in order to remove residual hydrogen and to obtain the final compound.

The heat treatment preferably consists of two stages. In a first stage, heating to 600 to 1000° C. is effected, preferably to 800 to 900° C., for a period of 1 hour to 5 hours, especially for 2.5 hours to 3.5 hours. Heat treatment can take place, for example, in a BN crucible. During said first stage the material is preferably treated in a $NH_3$ flow.

The first heating stage is preferably followed by a second heating stage. Therein, heat treatment is carried out at 1100 to 2500° C., preferably at 1200 to 2000° C., more preferably at 1400 to 1600° C. In a particularly preferred embodiment, heat treatment in the second heating stage is performed at 1100 to 1500° C. The second heating stage is preferably carried out for 2 to 10 hours, in particular, for 5 to 7 hours. The second heating stage favorably takes place in an inert atmosphere such as helium, nitrogen and/or argon, in particular, under a $N_2$ flow. For the heat treatment, e.g. standard horizontal is furnaces can be used.

Preferably, after the polymerization reaction, an additional heat treatment is applied to the polymer during which further polycondensation takes place. Upon raising the temperature, volatile components, mainly organic fragments, are removed. Depending on the nature of polymer, in the first step of the heat treatment, e.g. up to 900° C., usually low molecular weight organic fragments are released such as hydrogen, ammonia, methylamine, dimethylamine, methane, hydrogen cyanide, acetonitrile, trimethysilyl and etc. Ammonia flow during pyrolysis is very crucial in the synthesis of pure nitrides from carbon-containing precursors, since it removes carbon very efficiently and works as an aminizing or transaminizing agent, substituting alkylamines and enhances crosslinking. In the second step of the heat treatment, usually at about 1100-1200° C., residual hydrogen and small amount of nitrogen are released. After the all heat treatment, a pure inorganic solid residuum is obtained so that the end product is a ceramic.

Finally, a phosphor material, in particular, in powder form is obtained according to the invention. After the heating step (ii) preferably a ceramic material is obtained.

In a preferred embodiment, heating is performed in an atmosphere which contains no oxygen such as in a $NH_3$ atmosphere in the first heating stage and an inert gas atmosphere in the second heating stage. Therefore, no unwanted oxidation of activator ions takes place.

The emission wavelengths of the phosphors obtainable according to the invention are preferably in the red range, in particular, from 500 nm to 800 nm. Since the materials further exhibit excitation wavelengths in the blue range, they are especially useful as materials for wavelength conversion in phosphor-converted LEDs.

The phosphors produced according to the invention preferably have formula (I)

$$A_xB_zC_yD_qN_p$$

wherein
A denotes activators,
B denotes sensitizers,
C denotes charge compensators,
D denotes an element of Group XIII, XIV or XV of the Periodic Table of Elements,
N denotes nitrogen, and wherein
$0 \leq x \leq 2$,
$0 \leq z \leq 2$,
$0 \leq y \leq 4$,
$1 \leq q \leq 8$, in particular, $3 \leq q \leq 6$ and preferably q=5, and
$1 \leq p \leq 10$, in particular, $3 \leq p \leq 9$ and preferably p=8.

x, z and y are selected such that the metal ions balance the negative charge provided by $D_qN_p$.

In an especially preferred embodiment, phosphors of the formula $A_xB_zC_ySi_5N_8$ are formed, being (oxo)nitridosilicates. Also preferred are (oxo)nitridoalumino-silicates. Oxygen can be introduced into the materials, in particular, into the ceramics, adding water to the reaction medium and performing a partial hydrolysis during polymerization. Preferably, water is added in a controlled amount.

The invention relates to a novel synthesis method for the production of nitride-based phosphors. The present invention provides an easy and versatile method for the production of nitride-based phosphors. The invented method is based on the solubility of activator ions such as Eu and Yb metals and RE complexes where RE is at least one of the rare-earth metal chosen from the group of Ce, Pr, Nd, Sm, Eu, Gd, Tb, Dy, Ho, Er, Tm, Yb, Lu, Sc, Y, Sn and mixtures thereof, sensitizer ions like Sn, Mn, Zn, Sb, Pb, Bi and mixtures thereof and/or charge compensator ions such as Li, Na, K, Rb, Cs, Ca, Sr and Ba and mixtures thereof in pure liquid ammonia or ammonia mixed with a solvent and a reaction with binary halides such as $SiCl_4$, $GeCl_4$, $BCl_3$, $AlCl_3$ and mixtures thereof. Compared to conventional solid state reactions the present invention which is based on a reaction in a solution allows more homogeneous distribution of the elements in the final ceramic.

In a preferred embodiment, the present invention reports a novel synthesis route to $M_2Si_5N_8$:$Eu^{2+}$-based nitridosilicate phosphors based on a direct reaction of $SiCl_4$ with metals M (M=Ca, Sr, Ba) and/or Eu dissolved in liquid ammonia which is optionally diluted with a solvent such as hexane. The proposed reaction is as follow:

$$(2-x)M + xEu + 5SiCl_4 + 28NH_3 \rightarrow M_{2-x}Eu_xSi_5N_8 + 20NH_4Cl + 2H_2$$

The same synthesis route can be applied by using $Eu[N(Si(CH_3)_3)_2]_3$ instead of Eu metal according to following reaction:

$$(2-x)M + xEu[N(Si(CH_3)_3)_2]_3 + 5SiCl_4 + 28NH_3 \rightarrow M_{2-x}Eu_xSi_5N_8 + 20NH_4Cl + (2-1.5x)H_2 + 3xNH(Si(CH_3)_3)_2$$

In a further embodiment, the present invention reports the synthesis of phosphors $M^{II}_{2-2x}R_xM^I_xSi_5N_8$ based on a direct reaction of $SiCl_4$ with metals $M^I$ and $M^{II}$ ($M^I$=Li, Na, K, Rb, Cs, preferably $M^I$=Li, Na, K, and $M^{II}$=Ca, Sr, Ba) and a metal complex $R[N(Si(CH_3)_3)_2]_3$ (R=Ce, Tb, Pr, Nd, Sm, Dy, Mn, Er, Tm, Ho, Eu, Gd, Yb, Lu, Sc and/or Y, preferably R=Ce, Pr, Nd, Sm, Tb, Dy, Ho) in liquid ammonia which is optionally diluted with a solvent such as hexane. The proposed reaction is as follow:

$$(2-2x)M^{II} + xM^I + xR[N(Si(CH_3)_3)_2]_3 + 5SiCl_4 + 28NH_3 \rightarrow M^{II}_{2-2x}R_xM^I_xSi_5N_8 + 20NH_4Cl + (2-1.5x)H_2 + 3xHN(Si(CH_3)_3)_2$$

In a further embodiment, the present invention reports the synthesis of new phosphors $Ba_{1-2x}R_xM^I_xSi_7N_{10}$ based on a direct reaction of $SiCl_4$ with metals $M^I$ ($M^I$=Li, Na, K, Rb, Cs, preferably $M^I$=Li, Na, K) and a metal complex $R[N(Si(CH_3)_3)_2]_3$ (R=Ce, Pr, Nd, Sm, Eu, Gd, Tb, Dy, Ho, Er, Tm, Yb, Lu, Sc, Y and/or Mn, preferably R=Ce, Pr, Nd, Sm, Tb, Dy, Ho) in liquid ammonia which is optionally diluted with a solvent such as hexane. The proposed reaction is as follow:

$$(1-2x)Ba + xM^I + xR[N(Si(CH_3)_3)_2]_3 + 7SiCl_4 + 38NH_3 \rightarrow Ba_{1-2x}R_xM^I_xSi_7N_{10} + 28NH_4Cl + (1-1.5x)H_2 + 3xHN(Si(CH_3)_3)_2$$

After the reaction is completed, by-products can be easily recycled such as excess $NH_3$ at ambient condition in a cold trap, hexane under vacuum in a cold trap and $NH_4Cl$ via sublimation. The remaining powder mixture is heated in a BN crucible to 900° C. for 3 hours with $NH_3$ flow in a quartz tube and finally to 1500° C. for 6 hours with $N_2$ flow in an alumina tube.

A further aspect of the present invention refers to phosphors, preferably green phosphors, having formula (II) $E_mF_aG_aSi_gN_p$, wherein E is Ca, Ba or Sr and
m is 1-2a or 2-2a,
$0 \leq a \leq 1$ if m=2-2a, preferably $0 \leq a \leq 1$,
$0 \leq a \leq 0.5$ if m=1-2a, preferably $0 \leq a \leq 0.5$,
$1 \leq q \leq 8$, in particular q=5 or 7,
$1 \leq p \leq 10$, in particular p=8 or 10.
G is Li, Na, K, Rb or Cs, preferably Li,
F is Ce, Pr, Nd, Sm, Eu, Gd, Tb, Dy, Ho, Er, Tm, Yb, Lu, Sc, Y and/or Mn, preferably Ce or Tb.

According to an especially preferred embodiment, m+a+a is preferably 2 or 1.

According to the present invention, elements represented by the variables F and G as defined above are used to dope a host matrix. Said non-doped host matrix is present when a=0. Preferred host matrices of the present invention are $E_2Si_5N_8$ and $E_1Si_7N_{10}$. According to the invention, said host matrices are doped with elements represented by the variables F and G as defined above. Upon corresponding doping, a compound having the formula $E_{2-2a}F_aG_aSi_5N_8$ is obtained as a preferred embodiment of the present invention for host matrix $E_2Si_5N_8$. As a further preferred embodiment of an inventive compound, a compound having the formula $E_{1-2a}F_aG_aSi_7N_{10}$ is obtained for host matrix $E_1Si_7N_{10}$ by corresponding doping.

Especially preferred embodiments relate to phosphors which are selected from the group consisting of $Sr_{2-2a}Tb_aLi_aSi_5N_8$, $Ca_{2-2a}Tb_aLi_aSi_5N_8$, $Ba_{1-2a}Tb_aLi_aSi_7N_{10}$ and/or $Ba_{1-2a}Ce_aLi_aSi_7N_{10}$.

The invention further relates to a light source comprising a primary light emitting device, in particular, a blue light emitting device and a material obtained by the process described herein. Said phosphor material, in particular, serves for wavelength conversion. Preferably, the red emitting luminescent material obtained according to the method of the invention is combined with a green emitting phosphor to obtain a light source which emits a white secondary light. Thus, the phosphors obtained are preferably used in LEDs. The materials obtained are preferably used as phosphors for conversion of light, in particular, for conversion to higher wavelengths.

BRIEF DESCRIPTION OF THE DRAWINGS

In the text which follows, the invention is explained in more detail with reference to a plurality of exemplary embodiments. In drawings.

EXAMPLES

The function and advantage of these and other embodiments of the present invention will be more fully understood from the examples below. The following examples are intended to illustrate the benefits of the present invention, but do not exemplify the full scope of the invention.

All reactions were performed in a purified Ar atmosphere using either standard Schlenck technique or within a glove box. The final ceramics are not oxygen or moisture sensitive.

Example 1

Figure 1:
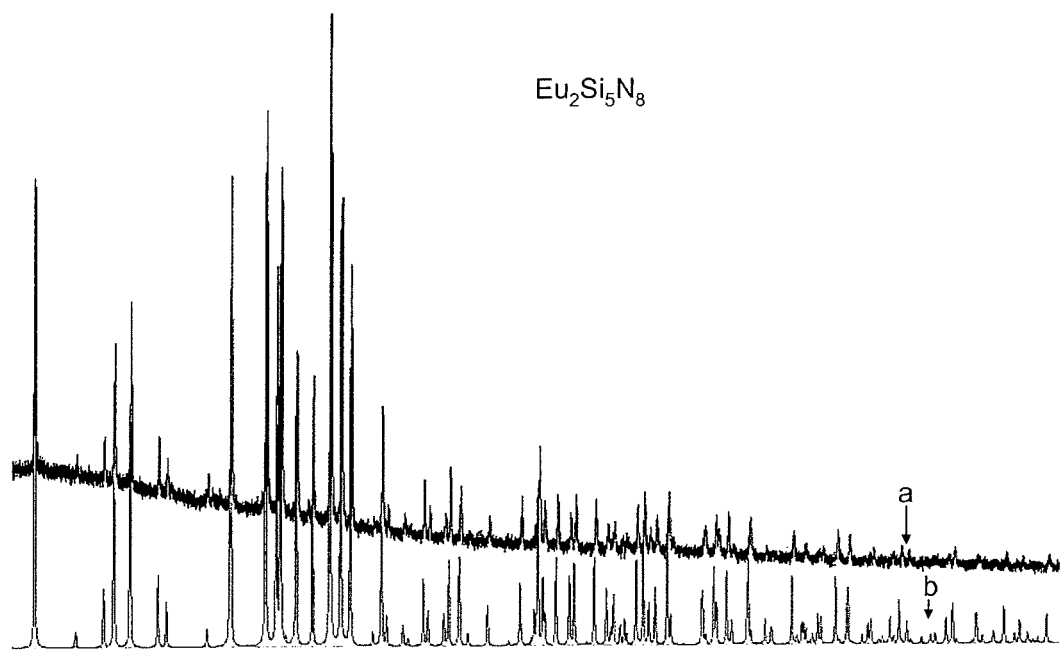
FIG. 1 shows a) experimental b) theoretical powder X-ray diffraction of $Eu_2Si_5N_8$
Figure 2:
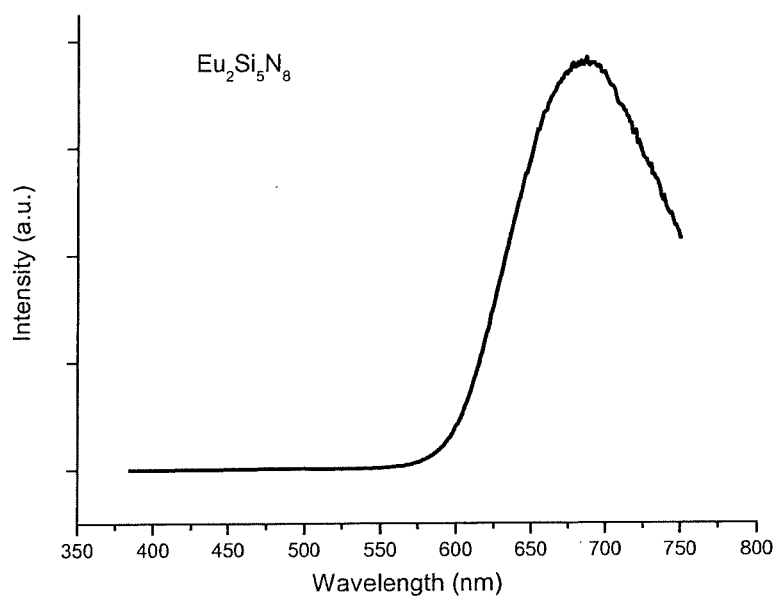
FIG. 2 shows the emission spectrum of $Eu_2Si_5N_8$ at 340 nm excitation
Figure 3:
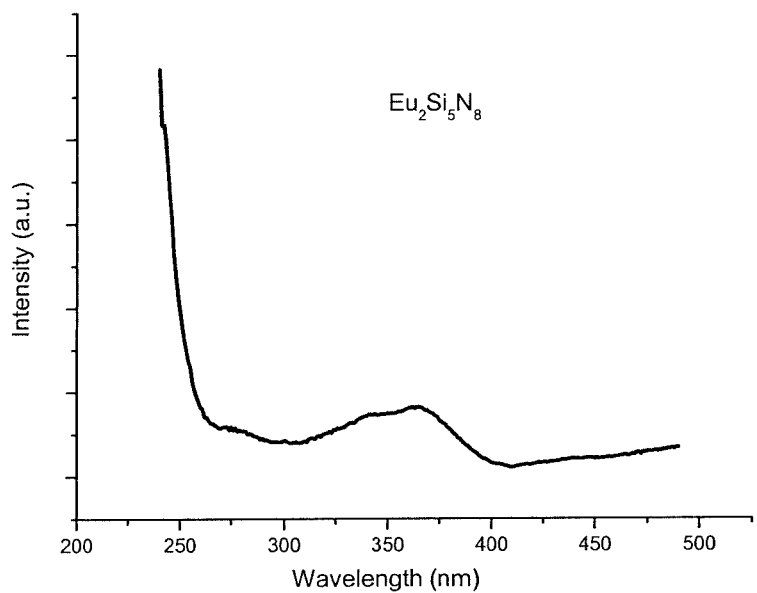
FIG. 3 shows the excitation spectrum of $Eu_2Si_5N_8$ at 622 nm emission

$Eu_2Si_5N_8$ 1.6576 ml (0.0145 mol) $SiCl_4$ in 30 ml hexane was reacted slowly with 0.8797 g (0.0058 mol) Eu metal dissolved in 100 ml liquid $NH_3$ which was diluted with 220 ml hexane at −76° C. It was then slowly reached to room temperature and excess $NH_3$ was removed with argon flow. Hexane was removed under vacuum in a cold trap. The remaining solid was sublimed at 210° C. and $10^{-3}$ mbar in order to remove $NH_4Cl$ salts. Almost salt free polymer was heated to 900° C. and dwelled for 3 hours under $NH_3$ flow in a BN crucible. Then, it was further heated to 1500° C. and dwelled for 6 hours under $N_2$ flow. At the end, orange-red powder of $Eu_2Si_5N_8$ was obtained. Powder X-ray diffraction of $Eu_2Si_5N_8$, emission spectrum at 340 nm excitation and excitation spectrum at 622 nm emission are shown in FIGS. 1-3.

Example 2

Figure 4:
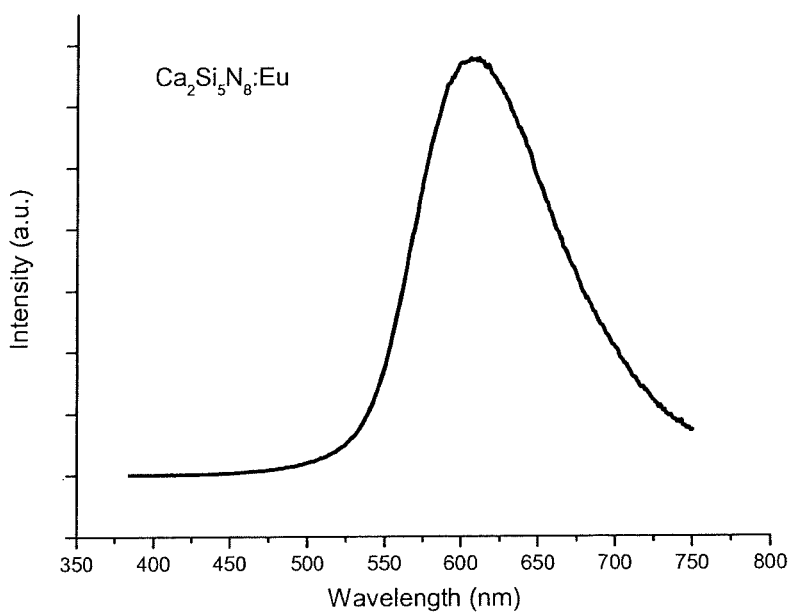
FIG. 4 shows the emission spectrum of $Ca_2Si_5N_8$:Eu at 340 nm excitation
Figure 5:
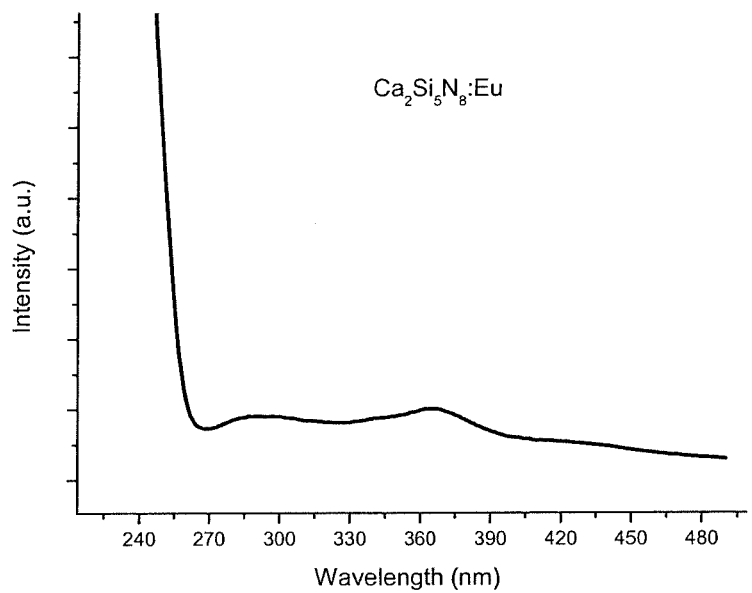
FIG. 5 shows the excitation spectrum of $Ca_2Si_5N_8$:Eu at 591 nm emission

$Ca_2Si_5N_8$:Eu 2.89 ml (0.0252 mol) $SiCl_4$ in 30 ml hexane was reacted slowly with 0.4035 g (0.01 mol) Ca and 0.0302 g (0.0002 mol) Eu metals dissolved in 100 ml liquid $NH_3$ which was diluted with 220 ml hexane at −76° C. It was then slowly reached to room temperature and excess $NH_3$ was removed with argon flow. Hexane was removed under vacuum in a cold trap. The remaining solid was sublimed at 210° C. and $10^{-3}$ mbar in order to remove $NH_4Cl$ salts. Almost salt free polymer was heated to 900° C. and dwelled for 3 hours under $NH_3$ flow in a BN crucible. Then, it was further heated to 1500° C. and dwelled for 6 hours under $N_2$ flow. At the end, orange-red powder of $Ca_2Si_5N_8$:Eu was obtained. Emission spectrum at 340 nm excitation and excitation spectrum at 591 nm emission of $Ca_2Si_5N_8$:Eu are shown in FIGS. 4 and 5.

Example 3

Figure 6:
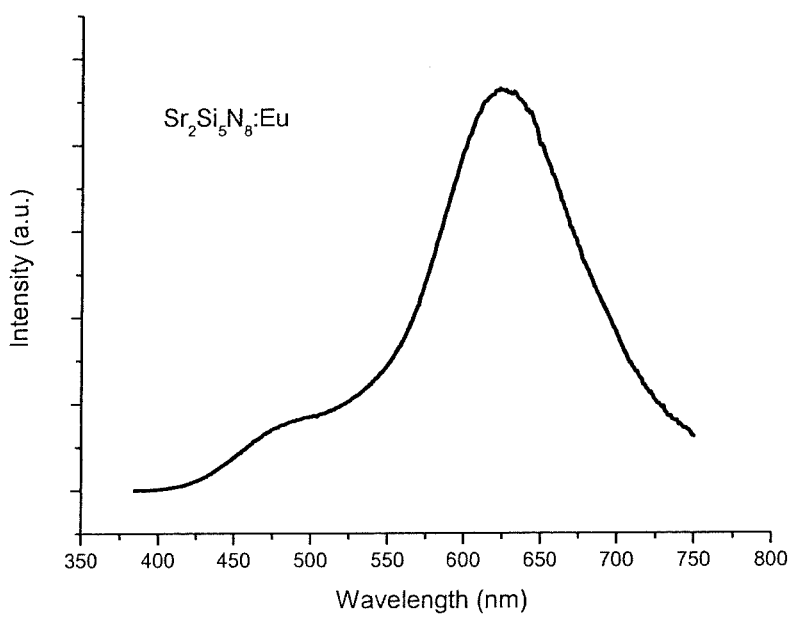
FIG. 6 shows the emission spectrum of $Sr_2Si_5N_8$:Eu at 340 nm excitation
Figure 7:
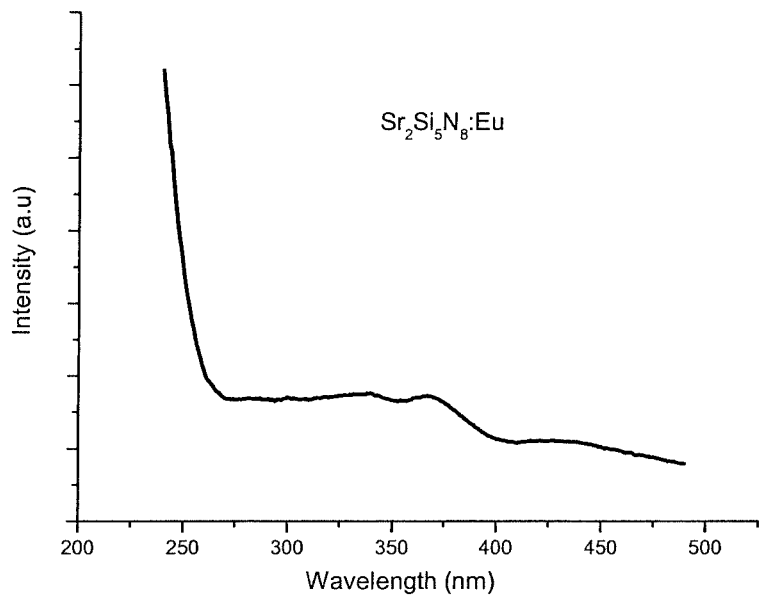
FIG. 7 shows the excitation spectrum of $Sr_2Si_5N_8$:Eu at 604 nm emission
Figure 8:
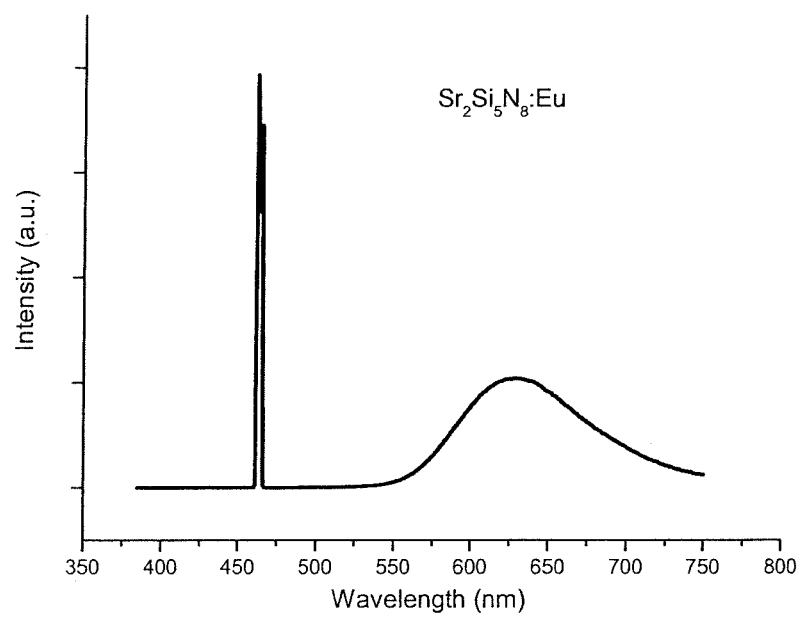
FIG. 8 shows the emission spectrum of $Sr_2Si_5N_8$:Eu at 462 nm excitation

$Sr_2Si_5N_8$:Eu 3.27 ml (0.0285 mol) $SiCl_4$ in 30 ml hexane was reacted slowly with 1.007 g (0.0115 mol) Sr and 0.0312 g (0.0002 mol) Eu metals dissolved in 100 ml liquid $NH_3$ which was diluted with 220 ml hexane at −76° C. It was then slowly reached to room temperature and excess $NH_3$ was removed with argon flow. Hexane was removed under vacuum in a cold trap. The remaining solid was sublimed at 210° C. and $10^{-3}$ mbar in order to remove $NH_4Cl$ salts. Almost salt free polymer was heated to 900° C. and dwelled for 3 hours under $NH_3$ flow in a BN crucible. Then, it was further heated to 1500° C. and dwelled for 6 hours under $N_2$ flow. At the end, orange-red powder of $Sr_2Si_5N_8$:Eu was obtained. Emission spectrum at 340 nm and 462 nm excitation and excitation spectrum at 604 nm emission are shown in FIGS. 6-8.

Example 4

Figure 9:
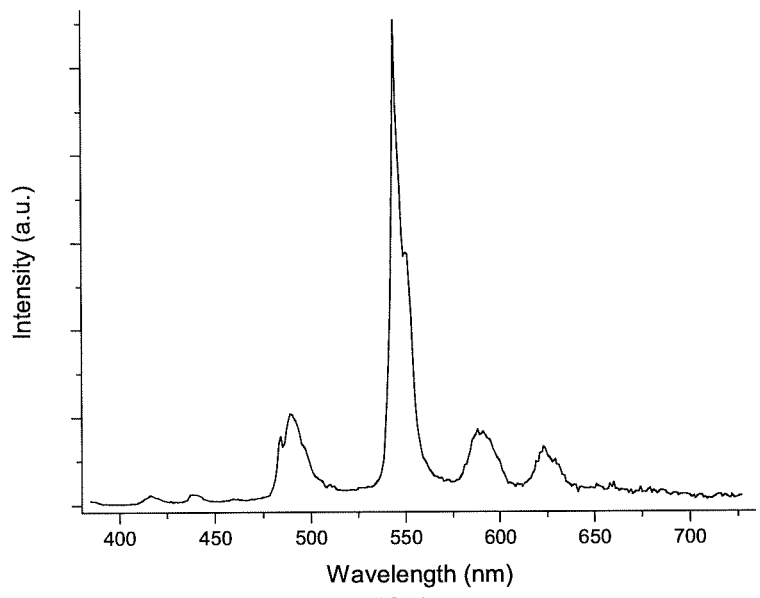
FIG. 9 shows the emission spectrum of $Sr_{2-2a}Tb_aLi_aSi_5N_8$ at 365 nm excitation

$Sr_{2-2a}Tb_aLi_aSi_5N_8$ 3.44 ml (0.03 mol) $SiCl_4$ in 30 ml hexane was reacted slowly with 1 g (0.01 mol) Sr metal, 0.0020 g (0.0003 mol) Li metal and 0.193 g (0.0003 mol) $Tb[N(Si(CH_3)_3)_2]_3$ in 100 ml liquid $NH_3$ which was diluted with 220 ml hexane at −76° C. It was then slowly reached to room temperature and excess $NH_3$ was removed with argon flow. Hexane was removed under vacuum in a cold trap. The remaining solid was sublimed at 210° C. and $10^{-3}$ mbar in order to remove $NH_4Cl$ salts. Almost salt free polymer was heated to 900° C. and dwelled for 3 hours under $NH_3$ flow in a BN crucible. Then, it was further heated to 1500° C. and dwelled for 5 hours under $N_2$ flow. At the end, white powder of $Sr_{2-2a}Tb_aLi_aSi_5N_8$ was obtained. Emission spectrum of $Sr_{2-2a}Tb_aLi_aSi_5N_8$ at 365 nm excitation is shown in FIG. 9.

Example 5

Figure 10:
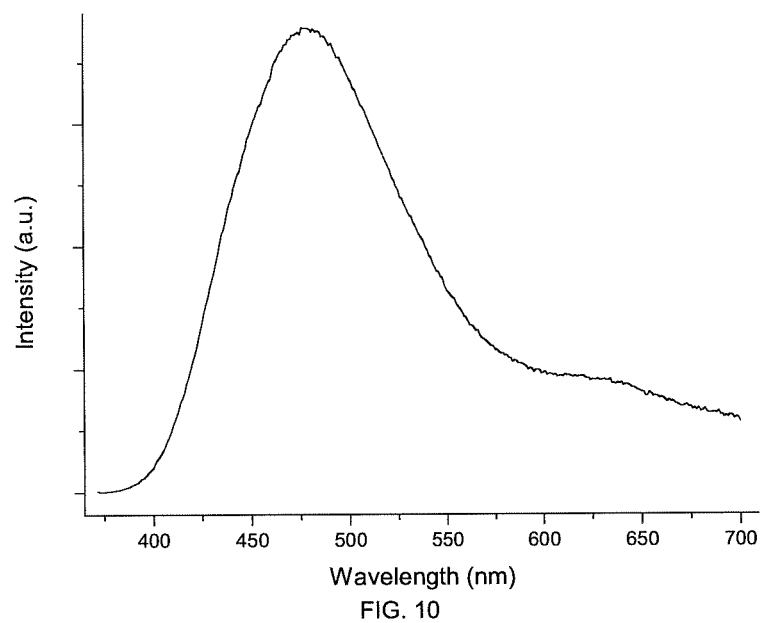
FIG. 10 shows the emission spectrum of $Ba_{1-2a}Ce_aLi_aSi_7N_{10}$ at 365 nm excitation

$Ba_{1-2a}Ce_aLi_aSi_7N_{10}$ 3.3 ml (0.029 mol) $SiCl_4$ in 30 ml hexane was reacted slowly with 1.5 g (0.01 mol) Ba metal, 0.0020 g (0.0003 mol) Li metal and 0.179 g (0.0003 mol) $Ce[N(Si(CH_3)_3)_2]_3$ in 100 ml liquid $NH_3$ which was diluted with 220 ml hexane at −76° C. It was then slowly reached to room temperature and excess $NH_3$ was removed with argon flow. Hexane was removed under vacuum in a cold trap. The remaining solid was sublimed at 210° C. and 10 mbar in order to remove $NH_4Cl$ salts. Almost salt free polymer was heated to 900° C. and dwelled for 3 hours under $NH_3$ flow in a BN crucible. Then, it was further heated to 1500° C. and dwelled for 5 hours under $N_2$ flow. At the end, white powder of $Ba_{1-2a}Ce_aLi_aSi_7N_{10}$ was obtained. Emission spectrum of $Ba_{1-2a}Ce_aLi_aSi_7N_{10}$ at 365 nm excitation is shown in FIG. 10.

The invented method is very convenient for mass production because all the starting materials are commercially available and relatively cheap compared to already given methods and it does not require multistep and complex systems. And even better, all excess and by-products can be easily recycled which is very important for environmental issues.

The invention claimed is:

1. A method for producing crystalline nitride phosphors comprising the step of
(i) reacting a halide with ammonia $NH_3$ and a metal source M to produce the crystalline nitride phosphors, wherein the halide is a binary halide designated as $DX_n$, wherein D denotes an element of Group XIII, XIV or XV of the Periodic Table of Elements, X denotes a halogen, and n=3, 4 or 5.

2. The method of claim 1, wherein the metal source M comprises an activator element.

3. The method of claim 2, wherein the activator element is Mn or a rare earth element selected from the group consisting of Ce, Pr, Nd, Sm, Eu, Gd, Tb, Dy, Ho, Er, Tm, Yb, Lu, Sc and Y or combinations thereof.

4. The method of claim 3, wherein the rare earth element is Eu or Yb.

5. The method of claim 1, wherein the metal source comprises a charge compensator.

6. The method of claim 5, wherein the charge compensator is an alkali metal or an earth alkali metal selected from the group consisting of Li, Na, K, Rb, Cs, Ca, Sr and Ba or combinations thereof.

7. The method of claim 6, wherein the alkali metal or earth alkali metal is Ba, Ca or Sr.

8. The method of claim 1, wherein the metal source further comprises a sensitizer selected from the group consisting of Sn, Mn, Zn, Sb, Pb and Bi or combinations thereof.

9. The method of claim 1, wherein the metal source M comprises elemental metal or metal ions.

10. The method of claim 1, wherein the binary halide is $SiCl_4$.

11. The method of claim 1, wherein the ammonia is employed as pure liquid ammonia.

12. The method of claim 1, wherein ammonia is mixed with a solvent.

13. The method of claim 12, wherein the solvent is a hydrocarbon solvent.

14. The method of claim 1, further comprising the step of (ii) heating the reaction product of step (i) at a temperature from 500 to 2500° C.

15. The method of claim 1, wherein a crystalline nitride phosphor having formula (I)

$$A_xB_zC_yD_qN_p \qquad (I)$$

is formed, wherein

A denotes an activator, wherein the activator is Mn or a rare earth element selected from the group consisting of Ce, Pr, Nd, Sm, Eu, Gd, Tb, Dy, Ho, Er, Tm, Yb, Lu, Sc and Y or combinations thereof, B denotes a sensitizer selected from the group consisting of Sn, Mn, Zn, Sb, Pb and Bi, C denotes a charge compensator, wherein the charge compensator is an alkali metal or an earth alkali metal selected from the group consisting of Li, Na, K, Rb, Cs, Ca, Sr and Ba or combinations thereof, D denotes an element of Group XIII, XIV or XV of the Periodic Table of Elements selected from the group consisting of B, Al, Ga, In, Tl, Si, Ge, Sn, Pb, P, As, Sb and Bi or combinations thereof, N denotes nitrogen, and x, z, y, q and p denote the stoichiometries of the elements comprised in the compound of formula (I), wherein, $0 \leq x \leq 2$, $0 \leq z \leq 2$, $0 \leq y \leq 4$, $1 \leq q \leq 8$, and $1 \leq p \leq 10$.

16. The method of claim 15, wherein D is Si, Ge, B or Al, q=5 and p=8.

17. A light source comprising:
(a) a primary light emitting device, and
(b) the crystalline nitride phosphor material obtainable according to the method of claim 1.

18. The light source of claim 17, further comprising a green emitting phosphor material.

19. The light source of claim 17, wherein the primary light emitting device comprises a primary blue light emitting device.

20. The method of claim 1, wherein the halogen is F, Cl, Br or I.

* * * * *